(12) United States Patent
Nishida et al.

(10) Patent No.: US 6,540,927 B2
(45) Date of Patent: Apr. 1, 2003

(54) SEMICONDUCTOR PACKAGING PART AND METHOD PRODUCING THE SAME

(75) Inventors: Makoto Nishida, Ookuchi (JP); Shinichi Nakamura, Ookuchi (JP)

(73) Assignee: Sumitomo Metal Mining Company, Ltd., Tokyo (JP)

( * ) Notice: Subject to any disclaimer, the term of this patent is extended or adjusted under 35 U.S.C. 154(b) by 0 days.

(21) Appl. No.: 09/025,257

(22) Filed: Feb. 18, 1998

(65) Prior Publication Data

US 2002/0182370 A1 Dec. 5, 2002

(30) Foreign Application Priority Data

Feb. 19, 1997 (JP) .............................. 9-034546

(51) Int. Cl.⁷ .................. H01B 13/00; H01L 23/495
(52) U.S. Cl. .................. 216/14; 428/131; 428/137; 428/138; 428/457; 428/195; 428/209; 428/901; 430/313; 430/314; 430/318; 29/827; 438/123; 438/121; 257/666; 361/813
(58) Field of Search ................ 428/131, 137, 428/138, 457, 195, 209, 901; 430/313, 314, 318; 29/827; 438/123, 121; 216/14; 257/666; 361/813; 174/52.4

(56) References Cited

U.S. PATENT DOCUMENTS 4,049,903 A * 9/1977 Kobler .................. 174/253
4,259,436 A * 3/1981 Tabuchi et al. .............. 430/314
4,642,160 A * 2/1987 Burgess ...................... 216/18
4,980,219 A * 12/1990 Hiraide et al. ............... 428/134
5,580,466 A * 12/1996 Tada et al. ..................... 216/3
5,661,086 A * 8/1997 Nakushima et al. ........ 257/668

* cited by examiner

Primary Examiner—William P. Watkins, III
(74) Attorney, Agent, or Firm—Dykema Gossett PLLC

(57) ABSTRACT

A semiconductor packaging part and a method of forming the part by applying a minute plating with a high positional accuracy to a semiconductor chip to be packaged. A pair of alignment holes 2, 3 are formed at a pitch equal to n-times (n=1, 2 . . . ) of a product pitch in a lengthwise direction along edges of a thin sheet metal 1, a resist layer covering the thin sheet metal 1 is arranged, a pit 14 for setting a packaging position of the part is formed in the thin sheet metal 1 on the basis of a part pattern formed by patterning according to, the alignment hole 2, a plated layer 17 for connecting the semiconductor packaging part's connecting terminal to a surface of the pit 14 onto a resist layer 15 covering the thin sheet metal 1 in which the pit 14 has been formed on the basis of a plating pattern 16a formed by patterning according to the alignment hole 3, the connecting terminal is connected to the plated layer 17 with a high accuracy, and the pit 14 and the plated layer 17 are formed in the thin sheet metal 1 with a high positional accuracy, thereby making it possible to package onto the semiconductor packaging part with a high accuracy.

2 Claims, 4 Drawing Sheets

SEMICONDUCTOR PACKAGING PART AND METHOD PRODUCING THE SAME

BACKGROUND OF THE INVENTION

The present invention relates to a semiconductor packaging part (such as, for example, a lead frame or the like) and a method of producing it. The semiconductor packaging part is formed from a thin sheet metal and is so designed as to permit the semiconductor chip to be packaged such that its connecting terminals are connected to the prescribed position and led to the external terminals.

DESCRIPTION OF THE RELATED ART

Parts like lead frames are widely used to package semiconductors. Such semiconductor packaging parts are formed from a thin sheet metal and are so designed as to permit the semiconductor chip to be mounted such that its terminals are connected to the prescribed position and led to the external terminals.

The semiconductor packaging parts of this kind are fabricated and formed usually by stamping (with a press mold) or etching and are completed by applying an electrical plating on specific parts. This electrical plating is accomplished by using a template having holes formed therein corresponding to the specific parts desired. Unfortunately, however, this method suffers from the disadvantage of lacking accurate positioning because the plating position varies depending on its position relative to the template and also on the working precision of the semiconductor packaging part itself.

In order to solve this problem, there has been proposed a method which consists of forming, prior to plating, a resist layer by electrodeposition on the semiconductor packaging part, forming a pattern at the desired position, and finally performing plating. This proposed method, however, is also unable to provide the desired plating accuracy because the plating position is determined by the external dimensions of the patterning mask and the product.

Further, the recent technological development needs accurate plating on a small area surrounding the half-etched part (in the dimple state) on the sheet metal of the semiconductor packaging part.

This requirement cannot be met by the conventional method because the resist layer electrodeposited on the half-etched part involves problems with adhesion, uniformity, and peeling.

Moreover, recent demands for reducing the size and increasing the density of the semiconductor chip require the semiconductor packaging part to have a higher accuracy for the plating position.

SUMMARY OF THE INVENTION

The present invention has been completed in view of the foregoing. It is a first object of the present invention to provide a semiconductor packaging part that permits fine plating with a high positional accuracy for the semiconductor chip to be packaged. It is a second object of the present invention to provide a method of producing a semiconductor packaging part that permits fine plating with a high positional accuracy for the semiconductor chip to be packaged.

The above-mentioned first object of the present invention is achieved by a semiconductor packaging part formed from a thin sheet metal so as to connect connecting terminals of a packaged semiconductor chip to predetermined positions for conduction to external terminals, characterized by having: a first pair of alignment holes which are repeatedly provided along edges of the thin sheet metal at predetermined intervals in its lengthwise direction and which perform a positioning for forming a part pattern on a first resist layer provided so as to cover the thin sheet metal; pits which are formed in the thin sheet metal on the basis of the part pattern formed on the first resist layer and which set a packaging position of the semiconductor chip; a second pair of alignment holes which are provided adjacent to and inside said first pair of alignment holes in the widthwise direction and which perform a positioning for forming a plating pattern on a second resist layer provided so as to cover the thin sheet metal after the pits have been formed; and a plated layer which is applied on surfaces of the pits on the basis of the plating pattern formed on the second resist layer and which connects the connecting terminals. Further, it is preferable that the thin sheet metal is in the form of rectangular strip or hoop.

The above-mentioned second object of the present invention is achieved by a method of producing a semiconductor packaging part formed from a thin sheet metal so as to connect connecting terminals of a packaged semiconductor chip to predetermined positions for conduction to external terminals, characterized by comprising the steps of: forming a first pair of alignment holes in the continuous thin sheet metal along it edges repeatedly at predetermined intervals in its lengthwise direction; forming a second pair of alignment holes in said thin sheet metal adjacent to and inside the first pair of holes in the widthwise direction; on the basis of a part pattern formed by patterning at predetermined positions located according to the first alignment holes in a first resist layer provided so as to cover the sheet metal, forming pits, for setting a packaging position of the semiconductor chip in the thin sheet metal; and on the basis of a plating pattern formed by patterning at predetermined positions located according to the second alignment holes in a second resist layer provided so as to cover the thin sheet metal in which the pits have been formed, forming a plated layer on surfaces of the pit, to which the connecting terminals are connected. Further, it is preferable that the continuous thin sheet metal is in the form of rectangular strip or hoop.

DESCRIPTION OF THE PREFERRED EMBODIMENTS

An explanation about an embodiment of the method of producing the semiconductor packaging part acceding to the present invention is given below, with reference to the accompanying figures.

Figure 1A:
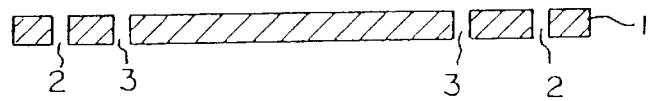
FIGS. 1a and 1b are respective cross-sectional and plan views of continuous, thin sheet metal treated according to the present invention and; illustrating the step of forming the first alignment holes and the step of forming the second alignment holes according to the method of the present invention.
Figure 1B:
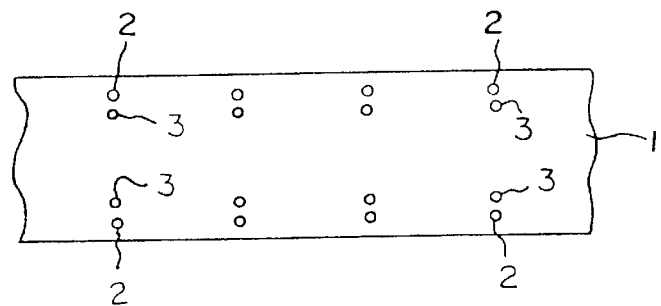

The method of the present invention starts with forming in a thin sheet metal 1, 0.125 mm thick and 160 mm wide, a first pair of alignment holes 2 and a second pair of alignment holes 3 by the first and second steps of forming the first and second alignment holes as shown in FIGS. 1(a) and 1(b). This thin sheet metal should preferably be coiled copper sheet in the form of rectangular strip or hoop. These alignment holes are arranged in the lengthwise direction along the edges. In other words, the first pair of alignment holes 2 have their centers 3 mm away from the edges and have a diameter of 2 mm. The second pair of alignment holes 3 are adjacent to and inside (in the widthwise direction) the first alignment holes 2 and have their centers 8 mm away form the edges and have a diameter of 2 mm. These holes are formed by press work at a pitch of 50 mm in the lengthwise direction. This pitch is equal to a product pitch or is n-times (n=1, 2 . . . ) of the product pitch.

Such pitch contributes to accurate finishing and plating pattern positioning and also permits the product to be coiled. Incidentally, the holes 2 and 3 may be formed also by etching.

Figure 2A:
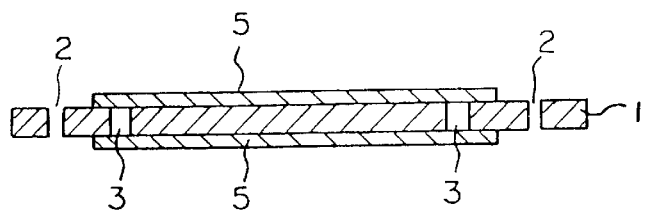
FIGS. 2a and 2b are similar cross-sectional and plan views; illustrating the step of attaching the first resist layer to the continuous, thin sheet metal according to the method of the present invention.
Figure 2B:
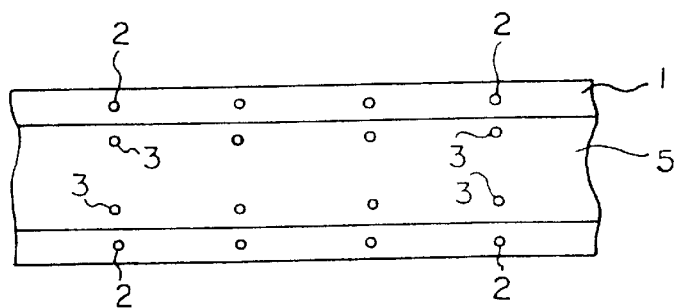

Then, as shown in FIGS. 2a and 2b, a 140 mm wide dry film (preferably photosensitive dry film) as the resist layer 5 is stuck to both sides or the thin sheet metal 1 in the region between the first alignment holes 2 at both edges of the thin sheet metal 1, such that it does not close the first alignment holes 2 and covers the second alignment holes 3.

Figure 4A:
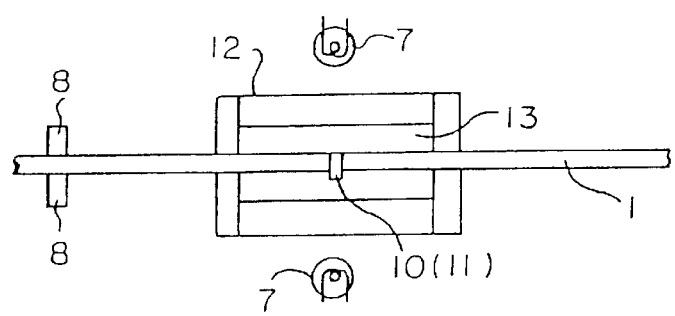
FIGS. 4a and 4b are similar an explanatory view; illustrating the exposure unit used in the method of the present invention.
Figure 4B:
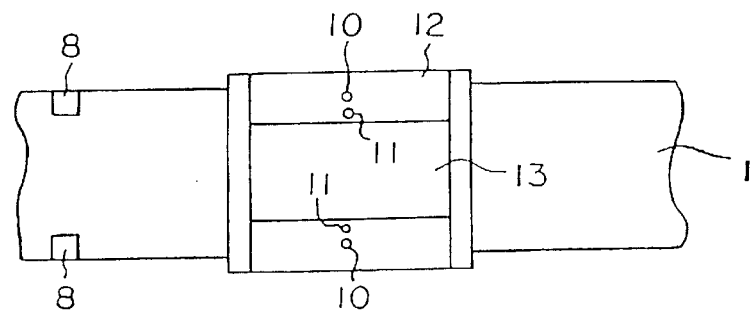

And, as shown in FIGS. 4a and 4b, a mask 13 on which the pattern of the part has been drawn is set, and a frame body 12 consisting of upper and lower two parts is arranged such that they hold between them the thin sheet metal 1 on which the resist layer 5 has been arranged. This frame body 12 has detachable pilot pins 10, 11, and light sources 7, such as UV light sources, are arranged in the vicinity of the mask 13 set on the upper and lower frame body 12.

Further, a position adjusting tool (not shown) to adjust the position of the thin sheet metal 1 with respect to the frame body 12 is provided so that the pilot pin 10 attached to the frame body 12 is inserted into the first alignment hole 2, with the thin sheet metal 1 being held between clippers 8.

Incidentally, in the embodiment shown in the drawings there is disclosed a mechanical method of detecting the position of the first alignment hole 2 by inserting the pilot pin 10 into the first alignment hole 2, but it is also possible to constitute so as to detect the above-mentioned position by an optical method such as a line sensor or a magnetic method.

Figure 3:
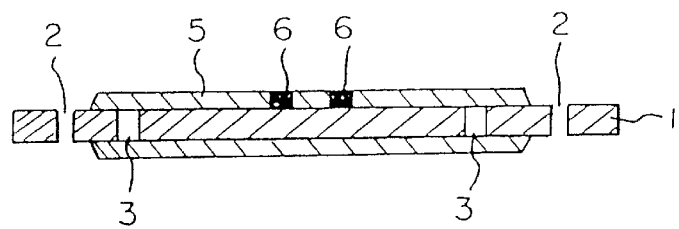
FIG. 3 is an explanatory view illustrating the step of exposure to form the pattern of the part according to the method of the present invention.

In the present invention, the light source 7 is turned on while the thin sheet metal 1 is being transported with the pilot pin 10 being inserted into the first alignment hole 2 and, as shown in FIG. 3, the pattern of the mask 13 is printed onto the resist layer 5 by a light from the light sources 7 as an exposed portion 6 of the part pattern.

Figure 5:
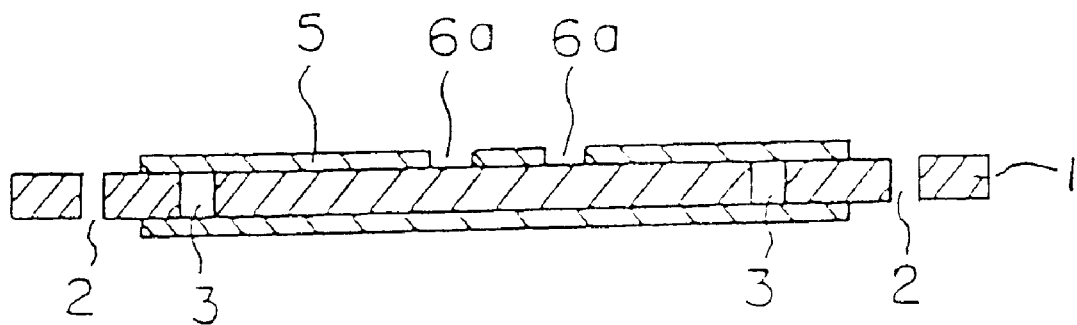
FIG. 5 is a cross-sectional view showing the pattern of the part formed according to the method of the present invention.
Figure 6:
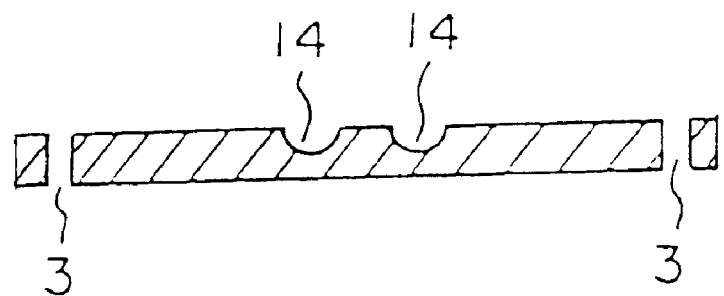
FIG. 6 is an explanatory view illustrating the step of forming pits according to the method of the present invention.

Subsequently, development is carried out with a 1% solution of sodium carbonate to form a pattern 6a of the part as shown in FIG. 5. Etching is performed with a solution of Iron chloride. The resist layer 5 is peeled with a 4% solution of sodium hydroxide. Thus, as shown In FIG. 6, pits 14 are formed in the thin sheet metal as the part mounting pattern and the side edges of the sheet metal 1 laterally of the resist layer 5, including the sprocket holes 2, are removed.

Figure 7A:
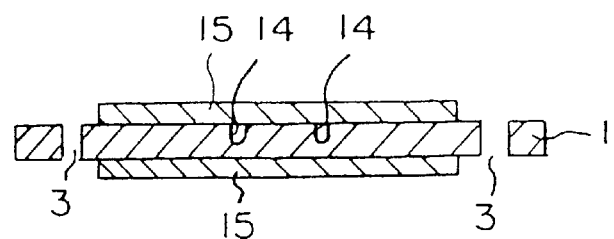
FIGS. 7a–7d are cross-sectional views sequentially illustrating the steps of forming the plated layer according to the method of the present invention.
Figure 7B:
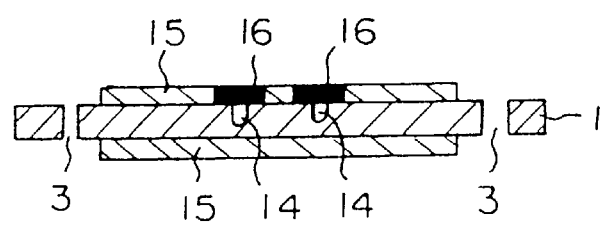

Here, the process proceeds to the steps of forming the plated layer and, as shown in FIG. 7(a), a resist layer 15 (which is a 120 mm wide photosensitive dry film) is stuck to both sides of the thin sheet metal 1 inside the second alignment holes 3 so as not to close these holes 3. And, under a state wherein the pilot pin 11 is inserted into the second alignment hole 3 by using the frame body holding the mask on which the plating pattern of the same type as shown in FIG. 4 has been drawn and the position adjusting tool, the light sources 7 such as UV light source are turned on, so that as shown in FIG. 7(b) an exposed portion 16 of the plating pattern is printed in the resist layer 15 by a light from the light sources 7.

Incidentally, in the embodiment shown in the drawings there is disclosed a mechanical method of detecting the position of the second alignment hole 3 by inserting the pilot pin 11 into the second alignment hole 3, but it is also possible to constitute so as to detect the above-mentioned position by an optical method or a magnetic method similarly to the case of detecting the first alignment hole 2.

Figure 7C:
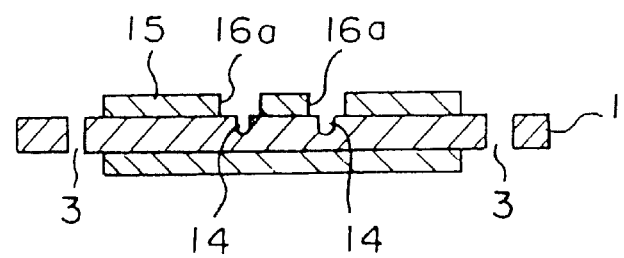
Figure 7D:
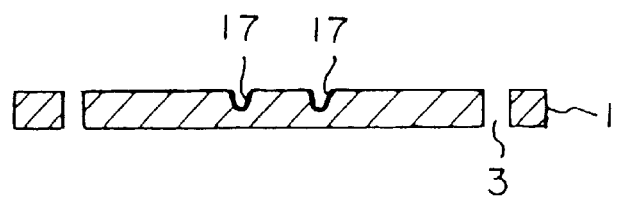

Subsequently, development is carried out with a 1% solution of sodium carbonate to form a plating pattern 16a as shown in FIG. 7(c). Silver plating is applied with a silver cyanide bath on an exposed pit 14 in the thin sheet metal 1. The resist layer 15 is peeled off with a 4% solution of sodium hydroxide. Thus, as shown in FIG. 7(d), there is formed a plated layer 17 on the surface of the pit 14 portion in the thin sheet metal 1.

To the thin sheet metal 1 having the plated layer 17 formed in this manner there is connected a connecting terminal of the semiconductor chip by a wire bonding and the connecting terminal is conducted to an external terminal.

On confirming a positional accuracy of the plated layer 17 formed by the present invention in such a manner as mentioned above, it was found that in the present invention a plated positional accuracy was greatly improved to ±50 $\mu$m, whereas in the event that a conventional plated plate was used the plated positional accuracy was ±300 $\mu$m. Further, in the present invention since the first alignment hole 2 and the second alignment hole 3 are simultaneously formed at a pitch which is equal to a product pitch or is n-times of the product pitch, it becomes very easy to work a part which requires a high plated positional accuracy and also it becomes easy to work a part which especially requires that a half-etched portion or a portion surrounding the former be plated with a high accuracy. Further, since the product can be formed in a coiled form, it becomes possible with a low cost to produce a high quality product without one's labor.

As mentioned above, according to the semiconductor packaging part of the present invention, since there is formed the plated layer on which the connecting terminal is connected to the surface of the pit on the basis of the plated pattern thus formed, since the connecting terminal of the semiconductor chip to be packaged is connected to the predetermined position of this plated layer and since the connecting terminal is conducted to the external terminals, the pit and the plated layer are formed in the thin sheet metal with a high positional accuracy and it becomes possible to package the semiconductor chip to the semiconductor packaging part with a high accuracy by connecting the connecting terminal of the semiconductor chip, which has been mounted on the semiconductor packaging part with a high accuracy, to the plated layer.

Furthermore, according to the method of producing a semiconductor packaging part of the present invention, since the plated layer for connection of the connecting terminal is formed on the surface of the pit on the basis of the plating pattern formed by patterning at the predetermined position located by the second alignment means in the second resist layer arranged so as to cover the thin sheet metal in which the pit has been formed by the plated layer forming step, since the connecting terminal of the semiconductor chip to be packaged is connected to the predetermined position of this plated layer and since the connecting terminal is conducted to the external terminal, it becomes possible to provide a method in which the pit and the plated player are formed in the thin sheet metal with a high positional accuracy and it is possible to package the semiconductor chip to the semiconductor packaging part with a high accuracy by connecting the connecting terminal of the semiconductor chip, which has been mounted on the semiconductor packaging part with a high accuracy, to the plated layer.

What is claimed is:

1. A method of producing a semiconductor packaging part which includes pits covered with plating layers for connecting terminals of semiconductor chips to external terminals, said method comprising the steps of:

(a) providing a thin metal sheet having a plurality of pairs of first aligned holes located along respective edges of said sheet at predetermined intervals in a lengthwise direction of said sheet and a plurality of pairs of second aligned holes located inwardly of respective pairs of said first aligned holes, (b) providing a frame with part pattern which can be positioned over one surface of said metal sheet, (c) positioning a first resist layer on said one surface of said metal sheet within said pairs of first holes and so as to cover said pairs of second holes, (d) positioning said frame with part pattern over said one surface of said metal sheet and said first resist layer so as to be accurately positioned relative to said pairs of first holes, (e) transferring said part pattern to said first resist layer, (f) removing said frame with part pattern from a position over said one surface of said metal sheet, (g) etching said metal sheet with first resist layer thereon to form pits in said metal sheet based on said part pattern in said first resist layer and to remove side edges of said metal sheet, including said pairs of first sprocket holes, laterally of said first resist layer, (h) removing said first resist layer, (i) positioning a second resist layer on said one surface of said metal sheet and within said pairs of second holes, (j) repositioning said frame with part pattern over said one surface of said metal sheet so as to be accurately positioned relative to said second pairs of holes, (k) transferring said part pattern to said second resist layer, and (l) forming plating layers on surfaces of said pits based on said part pattern in said second resist layer.

2. A method according to claim 1, wherein said frame with part pattern includes pin means, and wherein in step (d) said pin means are inserted into said pairs of first holes and in step (j) said pin means are inserted in said pairs of second holes.

* * * * *